(12) United States Patent
Fjelstad (10) Patent No.: US 7,049,929 B1
(45) Date of Patent: May 23, 2006

(54) RESISTOR PROCESS

(75) Inventor: Joseph Fjelstad, Maple Valley, WA (US)

(73) Assignee: Tessera, Inc., San Jose, CA (US)

( * ) Notice: Subject to any disclaimer, the term of this patent is extended or adjusted under 35 U.S.C. 154(b) by 211 days.

(21) Appl. No.: 10/136,964

(22) Filed: May 1, 2002

Related U.S. Application Data (60) Provisional application No. 60/287,921, filed on May 1, 2001.

(51) Int. Cl.
*H01C 1/012* (2006.01)

(52) U.S. Cl. .................. 338/310; 338/311; 338/252; 338/260; 338/320

(58) Field of Classification Search .......... 338/252, 338/260, 311, 319, 320, 310
See application file for complete search history.

(56) References Cited

U.S. PATENT DOCUMENTS

| | | | | |
|---|---|---|---|---|
| 2,994,846 A * | 8/1961 | Quinn | ............. | 338/308 |
| 3,432,792 A * | 3/1969 | Hatcher, Jr | ............. | 338/311 |
| 4,179,797 A * | 12/1979 | Johnson | ............. | 29/610.1 |
| 4,300,115 A * | 11/1981 | Ansell et al. | ............. | 338/314 |
| 5,164,699 A * | 11/1992 | Smith et al. | ............. | 338/310 |
| 5,232,865 A * | 8/1993 | Manning et al. | ............. | 438/382 |
| 5,282,312 A | 2/1994 | DiStefano et al. | | |
| 5,298,330 A * | 3/1994 | Stadnicar et al. | ............. | 428/432 |
| 5,346,750 A * | 9/1994 | Hatakeyama et al. | ............. | 428/209 |
| 5,347,258 A * | 9/1994 | Howard et al. | ............. | 338/333 |
| 5,367,764 A | 11/1994 | DiStefano et al. | | |
| 5,661,450 A * | 8/1997 | Davidson | ............. | 338/320 |
| 5,705,843 A * | 1/1998 | Roberts | ............. | 257/379 |
| 5,708,569 A | 1/1998 | Howard et al. | | |
| 5,780,143 A | 7/1998 | Shimamoto et al. | | |
| 5,912,507 A * | 6/1999 | Dunn et al. | ............. | 257/767 |
| 5,915,752 A | 6/1999 | DiStefano et al. | | |
| 5,980,785 A | 11/1999 | Xi et al. | | |
| 6,021,050 A | 2/2000 | Ehman et al. | | |
| 6,030,553 A | 2/2000 | Huang et al. | | |
| 6,047,463 A | 4/2000 | Ulmer | | |
| 6,100,787 A * | 8/2000 | Huang et al. | ............. | 338/204 |
| 6,130,601 A * | 10/2000 | Brown et al. | ............. | 338/307 |
| 6,225,570 B1 | 5/2001 | Ishiyama et al. | | |
| 6,229,098 B1 * | 5/2001 | Dunn et al. | ............. | 174/260 |

(Continued)

FOREIGN PATENT DOCUMENTS

JP 6-61020 * 3/1994 ............. 338/260

OTHER PUBLICATIONS

Ohmega Technologies, Inc., "Ohmega-Ply® Buried Resistor in High-Density Inter-Connect (HDI) BGA Package," http://www.ohmega.com/News.html, Apr. 12, 2002, pp. 1-4.

(Continued)

*Primary Examiner*—Karl D. Easthom
(74) *Attorney, Agent, or Firm*—Lerner, David, Littenberg, Krumholz & Mentlik, LLP (57) ABSTRACT

Circuit panels are provided with resistors in vias extending between the top and bottom surfaces of the panels. The resistors may be formed by depositing a composite in each via, as by depositing a dispersion of a conductive material and a dielectric or by depositing one or more thin layers of a conductor. The resistors may be disposed at interior locations buried within a multilayer circuit board formed by laminating one or more panels having such resistors with one or more additional elements.

4 Claims, 6 Drawing Sheets

U.S. PATENT DOCUMENTS

| | | |
|---|---|---|
| 6,266,874 B1 | 7/2001 | DiStefano et al. |
| 6,310,536 B1 | 10/2001 | Hellriegel |
| 6,455,918 B1 * | 9/2002 | Rolfson et al. ............. 257/536 |
| 2002/0021204 A1 | 2/2002 | Pankow et al. |

OTHER PUBLICATIONS

Borland, W.J., et al., "Embedded Passive Components in Printed Wiring Boards: A Technology Review," www.circuitree.com, Posted Mar. 1, 2001, pp. 1-8.

Chinoy, P., et al., "High Ohmic Value Embedded Resistor Material," www.circuitree.com, Posted Mar. 1, 2002, pp. 1-7.

D'Ambrisi, J., et al., "Plated Embedded Resistors for High Speed Circuit Applications," IPC Fall Annual Meeting, Orlando, FL, Oct. 11, 2001, pp. 1-4.

Fjeldsted, Dr. K., et al., "Embedded Passives: Laser Trimmed Resistors," www.circuitree.com, Posted Mar. 1, 2002, pp. 1-7.

St. Cyr, V., et al., "ARIES: Using Annular-Ring Embedded Resistors to Set Capacitor ESR in Power Distribution Networks," Manuscripts for EPEP2001, Oct. 29-31, 2001, Boston, MA, pp. 1-4.

Savic, J., et al., "Embedded Passives Technology Implementation in RF Applications," www.circuitree.com, Posted Jun. 1, 2002, pp. 1-9.

Shah, V.G., et al., "Timming and Printing of Embedded Resistors Using Demand-Mode Ink-Jet Technology and Conductive Polymer," IPC Printed Circuit Expo 2002, pp. 1-5.

* cited by examiner

RESISTOR PROCESS

CROSS REFERENCE TO RELATED APPLICATIONS

The present application claims the benefit of U.S. Provisional Application No. 60/287,921, filed May 1, 2001, the disclosure of which is hereby incorporated by reference herein.

BACKGROUND OF THE INVENTION

Resistors are incorporated in electronic circuits for many different purposes. Although almost every element of an electronic circuit has some resistance to flow of electrical current, the term "resistor" is used herein as referring to a device the primary purpose of which is to introduce resistance into the circuit.

Many electronic circuits are fabricated using circuit panels having electrically conductive traces extending on one or more dielectric layers, and, in some cases, having one or more conductors extending through one or more dielectric layers in holes or "vias." Considerable effort has been devoted in the art to development of circuit panels with resistors, capacitors and inductors formed as part of the circuit panel itself, commonly referred to as "embedded passives." Typically, resistors used as embedded passives are formed as strips or regions of material having relatively high electrical resistivity extending along a surface of a circuit panel. Resistors of this type consume valuable surface area on the panel. This may increase the overall size of the assembly. Further, certain resistors of this type can introduce significant unwanted capacitance or inductance. Accordingly, despite all of the effort in the art, still further improvement in resistors, in methods of making resistors and in assemblies incorporating resistors would be desirable.

SUMMARY OF THE INVENTION

One aspect of the invention provides a circuit panel including a panel body having top and bottom surfaces and a first via extending between said top and bottom surfaces. A composite resistor is disposed in the first via. The composite resistor includes a plurality of materials of different conductivities. The panel according to this aspect of the invention most preferably includes conductors disposed at the top and bottom surfaces of the panel in contact with said resistor. As further discussed below, the composite resistor may include a dispersion of a highly resistive material such as, for example, a polymer, and a less-resistive material such as, for example, a metal. The dispersion desirably has relatively high volume resistivity, so that resistors having practical values can be formed even when the dispersion completely fills a via of substantial diameter. Alternatively or additionally, the composite resistor may include two or more regions formed from two or more different materials as, for example, a multilayer structure.

The preferred panels according to this aspect of the invention can provide the embedded resistors without using appreciable space on the panel surface. For example, where the conductive elements on the panel surfaces include pads for connection to other structures, the resistors can be formed in alignment with the pads, so that the resistors are effectively "hidden" beneath the pads.

Another aspect of the invention provides a circuit element incorporating a stack of elements. The stack includes a first interior panel having top and bottom surfaces, edges, and a first interior via extending between said surfaces remote from said edges, and also includes an overlying element having a bottom surface confronting the top surface of said first interior panel to define an upper interface at the top surface of the first interior panel; and an underlying element having a top surface confronting the bottom surface of said first interior panel to define a lower interface at the bottom surface of the first interior panel. The element according to this aspect of the invention desirably includes a first resistor disposed within said first interior via remote from the exposed surfaces of the stack. Conductors extending within the stack, desirably include conductors at the upper and lower interfaces in contact with the resistor.

Still further aspects of the invention provide improved methods of fabricating resistors.

DETAILED DESCRIPTION OF THE PREFERRED EMBODIMENTS

Figure 1:
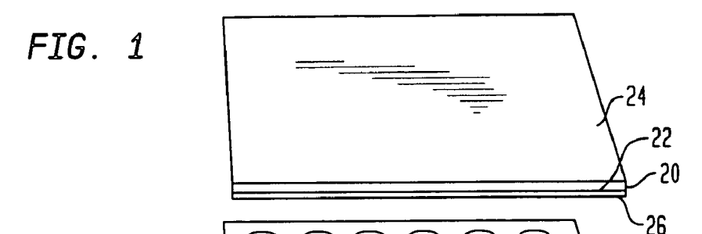
FIGS. 1–6 are diagrammatic perspective views depicting a panel in accordance with one embodiment of the invention during progressive stages in fabrication.

A process according to one embodiment of the invention, begins with a body in the form of a layer or sheet 20 of a polymeric dielectric material such as polyimide, or BT resin polymer having a bottom surface 22 and a top surface 24. The polymeric body typically has a thickness or dimension between its top and bottom surfaces on the order of 150 µm or less, most typically 100 µm or less and most commonly between about 25 and about 75 µm, and may be a dielectric layer of the type commonly employed in making flexible printed circuits or tape automated bonding ("TAB") tapes. Other thicknesses and types of dielectric layers may be employed. Also, the dielectric layer may be formed from a photoimageable material. As used in this disclosure, the term "photoimageable material" refers to a material which can be exposed to radiant energy such as visible or ultraviolet light in a pattern and which will cure or degrade in only those portions of the material exposed to such energy so that after such curing or degradation process, the exposed portion can be removed selectively, leaving the unexposed portion, or vice-versa.

A layer 26 of a conductive material such as copper is provided on bottom surface 22. The conductive layer may be a layer of copper of the type ordinarily used in fabrication of printed circuits as, for example, a copper layer having a thickness commonly referred to as "0.5 oz. (ounce)" to "2 oz.", i.e., about 0.017 mm to about 0.07 mm thick. Here again, other conductive materials and thicknesses can be used. The dielectric body and conductive layer can be provided as a clad copper foil, i.e., a laminate including a dielectric layer and a copper foil on one side.

Figure 2:
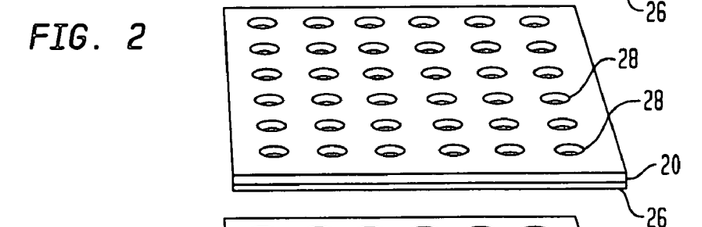

Before or after uniting body 20 with bottom conductive layer 26, holes or vias 28 (FIG. 2) are formed in body 20, so that the vias extend through the body, from the top surface 24 to the bottom surface 22, and thus extend to conductive layer 26. The vias may be formed by processes commonly used to form vias in flexible circuit panels as, for example, laser ablation, punching and drilling. Where the dielectric is a photoimageable material, the vias can be formed by selective exposure of the material and selective removal of uncured or degraded regions. In a further variant, the body can be formed by injection or compression molding of a thermoplastic or thermosetting polymer, and the holes can be formed as a part of the molding process using core pins extending through the cavity in the mold which forms the top and bottom surfaces of the body. As discussed further below, the electrical resistances of the finished resistors will depend in part on the cross-sectional areas of the vias, which in turn depends on their diameters or cross-sectional dimensions. Therefore, the via-forming process desirably is well-controlled to provide uniform via dimensions. Photoimaging and laser ablation typically offer good control. To maximize the resistances and minimize the size of the resistors, the smallest possible vias are desirable. However, for a given process having a set dimensional tolerance, the percentage difference in cross-sectional area among the various vias will be greater for smaller-diameter vias. Typically, vias of circular cross-sectional shape and between about 0.001 inches (0.025 mm) and about 0.010 inches (0.25 mm) are used.

In the next stage of the process, the vias are filled with resistive material 30 (FIG. 3), so that the resistive material contacts the bottom conductive layer 26 and extends through the vias to the top surface of body 20. The resistive material may be provided as a composite such as a paste which can be stenciled, silk screened or otherwise dispensed into the holes in the dielectric layer. Such a paste may include a highly conductive material such as a metal powder metal oxides, graphite or other form of carbon or semiconducting materials in a nonconductive matrix such as a polymer. The polymer may be in a fluid form. Optionally, the composite may be applied in a fluid state and cured to a solid or more nearly solid condition before or after application of one or both conductors. For example, if the paste includes a thermoplastic polymer, the paste may cure by cooling. Alternatively or additionally, if the paste includes a solvent, the paste may cure upon evaporation of the solvent. Also, the polymer component of the composite material may be a settable monomer, oligomer or short-chain polymer adapted to cross-link or polymerize either spontaneously or in response to applied heat or radiant energy as, for example, an epoxy resin. Composite resistive materials of the types disclosed, for example, in U.S. Pat. Nos. 6,030,553 and 5,980,785 can be employed. The composite may include a glass or other inorganic dielectric in place of or in addition to a polymer. Alternatively, the resistive material may be of uniform composition as, for example, a polymer having relatively low conductivity as, for example, a polyaniline.

Figure 3:
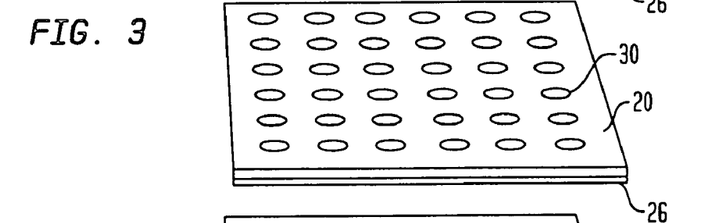

In a further variant, the composite or a component of the composite may be deposited by an electrophoretic deposition process. In electrophoretic deposition, charged particles are attracted to an oppositely charged conductive surface exposed within a liquid bath. Thus, if the body 20 with the bottom conductive layer 26 are deposited in an appropriate electrophoretic coating bath and the correct charge is applied to conductive layer 26, the particles will be deposited on the exposed surfaces of the conductive layer within holes 28. The surface of the conductive layer facing away from body 20 may be masked to prevent deposition. The deposited particles are then cured, typically by heating, to form a coating on the exposed surfaces. The individual particles applied in an electrophoretic process may be of uniform process, or may themselves include multiple materials. For example, each particle may include a material of relatively high conductivity surrounded by a layer of lower-conductivity material.

Figure 4:
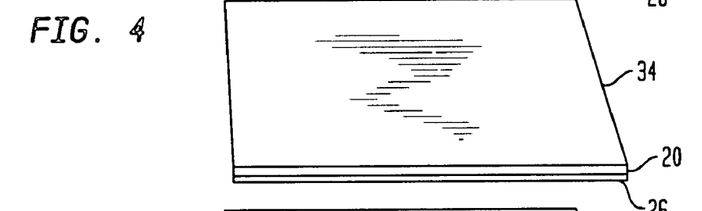

After filling the vias with the resistive material, a top conductive layer 34 is applied on the top surface of body 22. Top conductive layer 34 also contacts the resistive material 30 (FIG. 3) in the vias. The top conductive layer may be similar to the bottom conductive layer 26. For example, the top conductive layer 32 may be applied by laminating a continuous sheet of copper foil on the top of body 20.

Figure 5:
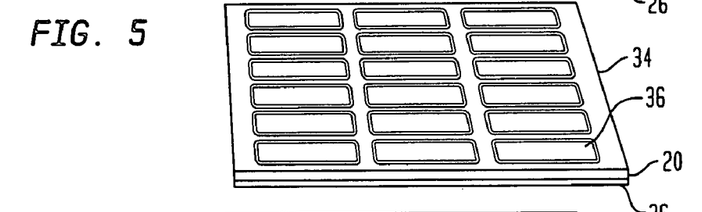

Then, a mask 36 (FIG. 5) such as a photoresist or other etch-resistant material is applied on the exposed surfaces of the top conductive layer 34 so that the etch-resistant material covers the regions where the conductive material of this layer is to remain. This step can be performed by applying a coating of a conventional photoresist and exposing the resist to patternwise illumination, as in a conventional photoresist patterning process. A similar etch-resistant material (not shown) is applied on the exposed surface of the bottom conductive layer 26. The assembly is then exposed to an etchant which attacks the conductive material in areas not covered by the photoresist, and the photoresist is removed, leaving the conductive material in the regions covered by the photoresist. Those parts of the top conductive layer 34 which remain after etching form top conductors 38 extending along the top surface 24 of the dielectric body 20, whereas those portions of the bottom conductive layer 26 which remain form bottom conductors 40 (FIG. 7) extending along the bottom surface 22 of the body.

In a variant of this process, an electrically conductive etch-resistant material which also enhances soldering or other bonding operations, such as a thin layer of gold, may be applied to the copper or other conductive material in regions where the conductive material is to remain. The conductive material serves in place of the photoresist, and remains as a part of the conductors at the end of the process.

Figure 6:
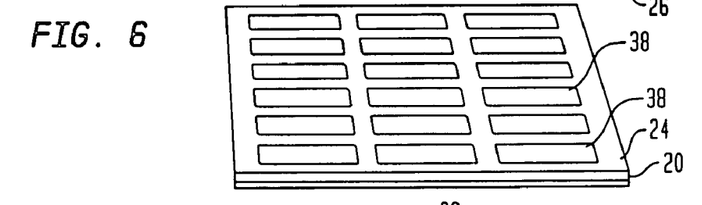
Figure 7:
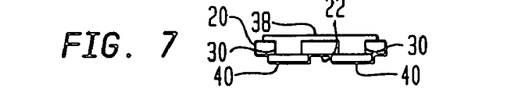
FIG. 7 is a diagrammatic sectional view of a unit formed from the panel shown in FIGS. 1–6.

The resistive material 30 within each via forms a separate resistor. Each such resistor is connected to a top conductor 38 and to a bottom conductor 40. In the particular embodiment depicted in FIGS. 1–7, the top conductors 38 are in the form of elongated strips, each such strip contacting and connecting resistors 30. The bottom conductors 40 are in the form of spots or pads, each covering the bottom end of one resistor 30. These pads can serve as bonding terminals. Thus, the panel depicted in FIG. 6 includes numerous electrically-independent units, each of which includes two resistors 30 connected in series by one top conductor or strip 38 as shown in FIG. 7. The panel can be used in the form depicted in FIG. 6, to provide an array of resistor units.

Alternatively, the panel can be subdivided by severing body 20 to separate individual units, each including one or more of the resistors. Each unit can be mounted to a conventional circuit panel such as a circuit board, as by conventional surface-mount techniques. A flexible dielectric body 20 will form flexible units which are particularly compatible with flexible circuit panels.

The resistance value of each resistor is controlled by the resistivity of the resistor material and the volume and configuration of the resistor material in the hole. In the embodiments illustrated, the composite resistive material 30 entirely fills each via 28. Thus, the configuration and volume of each resistor depends upon the dimensions of the via. To assure accurate and uniform resistance values, the dimensions of the vias desirably are controlled to minimize unintended variations in their size and shape. Desirably, the resistance value is controlled to within ±20% of its nominal value, and still closer control, such as to within ±10% of nominal or within ±5% of nominal, can be employed in certain applications. Where a large number of resistors are fabricated to the same nominal value, they desirably have a distribution of resistances falling substantially within about ±20% or less of the mean actual value, i.e., such that the 3σ limit of the distribution of resistance values is ±20% of the mean value. Even closer control, with a narrower distribution, is still more desirable.

The resistance of each resistor, as measured between the top conductor 38 and bottom conductor 40 in contact with the resistor, typically is at least about 100 milliohms, more typically at least about 500 milliohms, and desirably at least about 1 ohm, more desirably at least about 10 ohms. Far higher values can be used. By contrast, conventional plated through vias used in circuit boards commonly have resistances on the order of milliohms, and these resistances vary widely among different vias of nominally the same dimensions.

Resistors having useful resistance values can be fabricated in this manner from readily available materials and using individual process steps within the limits of current technology. Merely by way of example, one composite resistive material shown in the aforementioned U.S. Pat. No. 6,030,553 contains an epoxy polymer and particles of carbon black dispersed in the polymer, and has a volume resistivity of 24 ohm-cm at room temperature. A cylindrical resistor 0.001 inch (0.025 mm) in diameter extending through a dielectric body 75 μm thick dielectric body completely filled with this material will have a resistance of approximately 35.5 kiloohms between top and bottom conductors. This value is based upon the formula $R=\rho l/A$, where $\rho$ is the volume resistivity of the resistor material in ohm-cm, $l$ is the length of the resistor between the top and bottom conductors, and A is the cross-sectional area of the resistor, i.e., the mean area of a plane transverse to the top-to-bottom axis of the resistor. A similar resistor 0.010 inches (0.025 cm) in diameter will have a resistance of approximately 355 ohms.

To illustrate the effect of via size on variation in the resistance of the finished resistors, variation in via diameter of ±0.0005 inches will produce a variation of approximately ±10% in the resistance of a 0.010-inch diameter resistor formed in a 0.010-inch diameter via. By contrast, a similar variation of ±0.0005 inches will produce a variation of approximately ±75% in the resistance of a 0.001-inch diameter resistor. The value of ±0.0005 inches is an arbitrary example, for illustrative purposes only. In some production processes which can be used to form the vias, such as molding, photographic exposure and laser ablation, tolerances on the order of 1–2 microns or better can be maintained. However, the principle that a larger via diameter reduces sensitivity to variations in via diameter applies regardless of the actual amount of variation encountered with the particular via-forming processes. Because composite resistive materials can have volume resistivity substantially higher than the volume resistivity of pure metals, the composite resistive materials allow the use of substantial nominal via diameters, and thus make it easier to control the resistance of the finished resistors with reasonable tolerances on the diameters of the vias.

Where the resistor is formed by completely filling a via with a resistive material such as the composite material discussed above with reference to FIGS. 1–7, it is desirable to use a resistive material having volume resistivity on the order of $10^{-3}$ ohm-cm or higher, desirably $10^{-1}$ ohm-cm or higher, preferably 1 ohm-cm or higher. Still higher resistivities such as 10 ohm-cm or more can be employed. The upper bound on the desirable value of resistivity in such a system is set by the desired resistance and by the maximum allowable via diameter. The maximum allowable via diameter will depend on factors such as space available for the vias and by effects such as capacitance between very large conductors covering the top and bottom of very large vias. Typically, the resistivity is below $10^4$ ohm-cm, and more preferably below $10^3$ ohm-cm. By contrast, solid metals normally used as resistor materials such as the nickel-chromium-iron alloy sold under the trademark NICHROME, have resistivity on the order of $10^{-4}$ ohm-cm.

Figure 8:
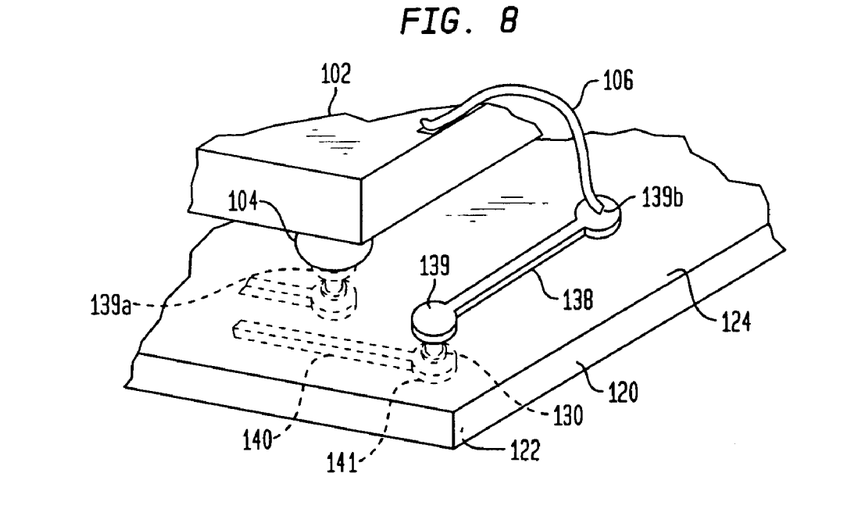
FIG. 8 is a fragmentary, diagrammatic perspective view of an assembly in accordance with a further embodiment of the invention.

The techniques for forming resistors discussed herein also can be applied in forming circuit panels which are not severed but which are used as a unit. For example, a portion of a circuit panel 120 depicted in FIG. 8 has conductors 138 disposed at its top surface 124 in the form of elongated traces with pads 139 provided at appropriate locations along the traces. The pads typically have dimensions transverse to the direction of elongation of the traces greater than the corresponding dimensions of the traces. Similar traces 140 and pads 141 are provided on the bottom surface 122. Although only a few traces and pads depicted in FIG. 8, a typical circuit panel may have scores or hundreds of these features. In a high-density flexible circuit panel, the traces may be as narrow as 25 microns or even 15 microns, whereas the pads may be circular structures having diameters on the order of 50–100 microns or more. The pads can be used, for example, to connect the circuit panel with other elements. Thus, in the embodiment shown in FIG. 8, a pad 139a on the top surface is connected to semiconductor chip 102 by a mass of a conductive bonding material such as a solder 104 disposed on the pad, whereas another pad 139b is connected to another contact on the chip 102 by a wire 106. In a structure having elongated traces and pads, the resistors 130 can be disposed in these aligned with the pads, so that the resistors are disposed in regions of the panel covered by the pads. Because the pads have large dimensions in all directions, they can accommodate these substantial cross-sectional dimensions. The conductors on a circuit panel may include further features. For example, the circuit panel may be a tape of the type used in tape automated bonding ("TAB"). In such a tape, the traces and pads are formed integrally with the leads projecting over a hole in the tape so that the leads can be bonded to a semiconductor chip. Alternatively, the pads and traces can be formed integrally with the lead connection sections of the types disclosed in U.S. Pat. No. 5,915,752, the disclosure of which is hereby incorporated by reference herein. Leads of this type can also be bonded to a semiconductor chip or other microelectronic element. The pads may serve to mount the panel and hence the chip or other element connected to the leads to a larger circuit panel. In this case, the circuit panel serves as a part of the semiconductor chip package.

Figure 9:
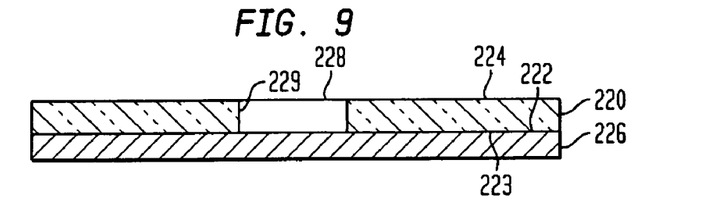
FIGS. 9–12 are diagrammatic sectional views depicting a panel in accordance with a further embodiment during successive stages in the fabrication procedure.

A composite resistor need not be formed as a dispersion as discussed above. Thus, the composite resistor may include two or more distinct regions composed of two or more materials. One process for depositing composite resistors in vias begins with an assembly of a body 220 (FIG. 9) formed from dielectric material having a top surface 224 and bottom surface 223 and numerous vias 228 extending between the top and bottom surfaces similar to the vias discussed above. The dielectric material of the body 220 defines a wall 229 encircling each via. Although the via 229 depicted in FIG. 9 is shown as a perfect cylindrical via having a wall 229 in the form of a right circular cylinder, the via wall may be tapered or sloped. For example, the via wall may slope outwardly away from the central axis of the via adjacent the top surface, the bottom surface or both. Here again, a bottom conductive material 226 is provided on bottom surface 222 so that the bottom conductive material underlies the vias and extends across each of the vias. In FIG. 9, the bottom conductive material is illustrated as a continuous conductive layer, but the material may instead be provided as a series of discrete conductive elements such as pads overlying the vias where resistors are to be formed.

Figure 10:
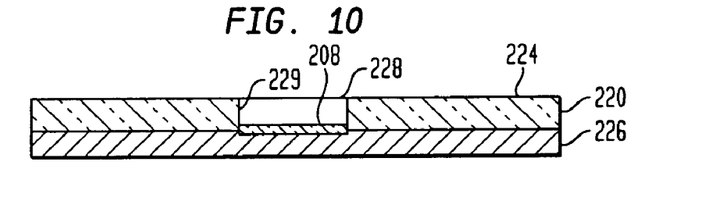

As seen in FIG. 10, a first layer 208 of a relatively high-resistivity material is deposited in each 228 so that this layer extends across the via and covers the bottom conductive material 226. This material desirably has resistivity comparable to or higher than the resistivity discussed above for a composite dispersion. The first, high-resistivity layer typically will be on the order of a few nanometers to a few microns thick. Most preferably, the material in layer 208 is deposited at least in part from a gas or vapor phase using a process such as evaporation, sputtering, chemical vapor deposition or the like. Also, the deposition process may include reaction with the material of bottom conductive material 226. For example, where the bottom conductive material includes a metal such as copper, the first resistive layer 208 may be formed by exposing the assembly to oxidation under controlled conditions as, for example, exposure to an oxidizing plasma. Other metallic compounds such as nitrides, sulfides and fluorides can be formed by exposure to a gas or plasma containing the appropriate nonmetallic element or elements. The first layer desirably is thinner than body 220 and hence does not extend all the way to the top surface 224.

Figure 11:
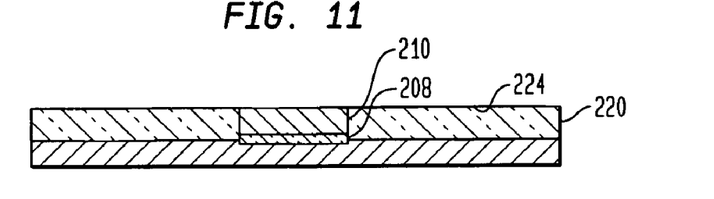
Figure 12:
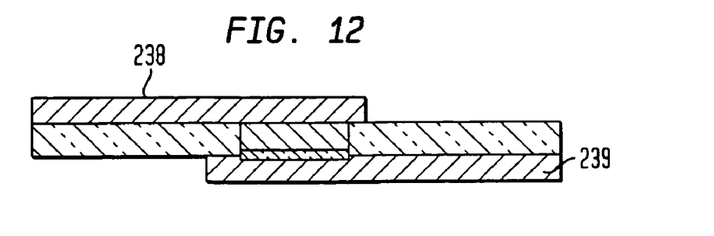

In the next stage of the process, a second layer 210 formed from a material having resistivity lower than that of the first layer is deposited into the vias. The second material may be a resistive dispersion as discussed above or else may be a highly conductive material such as a pure metal as, for example, copper. The second layer may be applied by conventional purposes as, for example, by electroplating or by the processes discussed above for deposition of the resistive composite dispersion. The second material desirably extends to the top surface 224 of via body 220. At this stage of the process, the resistor is complete. If desired, a top conductive material may be applied and may be formed into top conductors 238. Similarly, the bottom conductive material may be formed into conductors 239 (FIG. 12). Where the second layer is formed from a highly conductive material, the process of applying the top conductive material may be performed as part of the same deposition step used to form the second layer.

Figure 14:
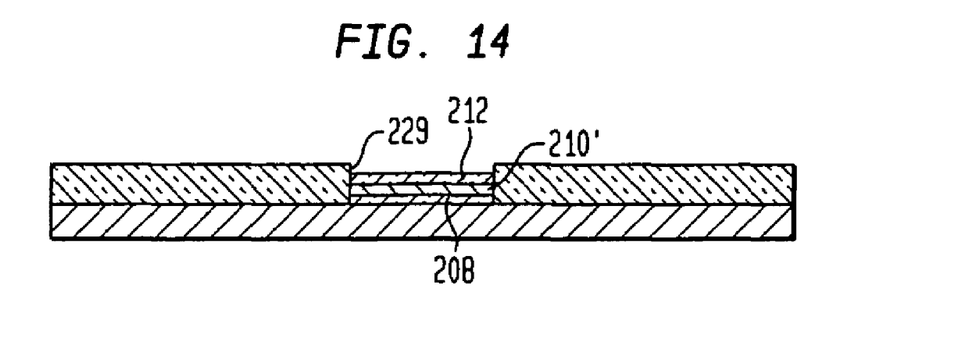
Figure 15:
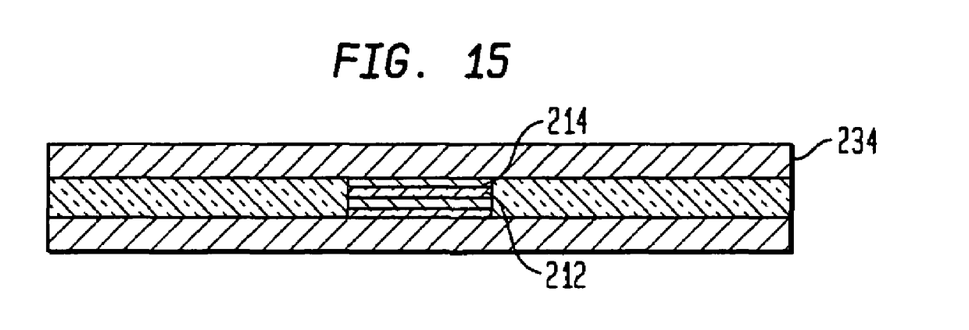

In a variant of this process, the first layer 208 of highly resistive material is formed in the same manner, but the second layer 210' of a less resistive material (FIG. 13) is deposited so that it does not extend all the way to the top surface. Following deposition of the second layer, a third layer 212 of relatively high-resistivity material (FIG. 14) is deposited so that the third layer extends over the second layer and extends all the way to the walls 229 of the via. Depending upon the deposition process used to apply the second layer 210', some small amount of material from the second layer may extend on the via walls. Desirably, this small amount of material is removed prior to deposition of the third layer as, for example, by exposing the assembly to a flash etching step sufficient to remove the material on the walls but not sufficient to remove the second layer. Following deposition of the third layer 212, a further, less resistive layer 214 may be deposited over the third layer within the via. Alternatively, if the combined thickness of the first three layers is sufficient to reach the top surface of the body, this step may be omitted. A top conductive material 234 desirably is applied over the resistor. Here again, the top conductive material may be applied either as a continuous layer which is typically etched to fashion it into discrete conductors or may be applied as discrete conductors. The resistance of the completed resistor will be the series resistance of layers 208, 210', 212 and 214. Typically, the resistances of layers 210' and 214 are insignificant in comparison to the resistances of layers 208 and 212.

Figure 13:
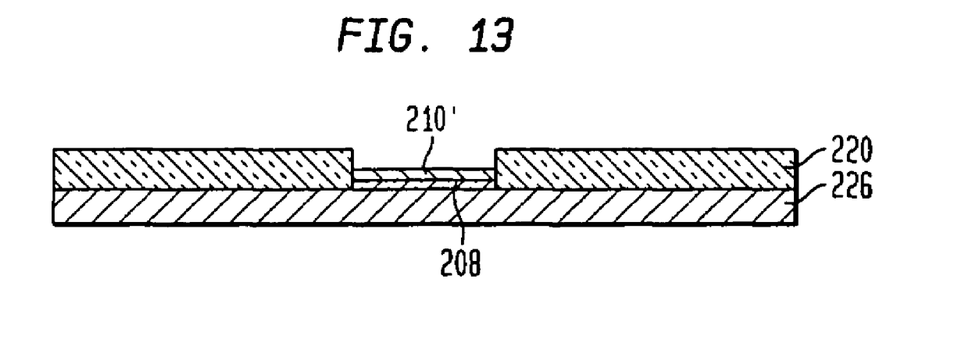
FIGS. 13–15 are views similar to FIGS. 9–12 but depicting a panel in accordance with yet another embodiment of the invention during successive stages in its fabrication.

In the embodiments discussed with reference to FIGS. 9–12 and with reference to FIGS. 13–15, each resistor is fabricated in two or more stages. Preferably, the results of the first stage in which resistive material is deposited are monitored and the conditions used in one or more subsequent stages are controlled at least in part based upon the results of this monitoring. For example, in the embodiment of FIGS. 13–15, the resistance can be monitored after depositing the first resistive layer 208 but prior to deposition of third layer 212. For example, resistance can be measured after deposition of the conductive layer 210' but before deposition of the layer 212. If the resistance after deposition of layer 208 is slightly higher than the anticipated or nominal value, the conditions used to deposit layer 212 are adjusted to favor a slightly lower resistance in that layer and vice versa so that the aggregate resistance of the finished resistor is close to the nominal value. Similarly, in the embodiment of FIGS. 9–12, where the second layer has some significant resistance as, for example, where second layer 210 is formed from a composite resistive material, the conditions used in depositing layer 210 can be selected based upon the measured resistance of the first layer 208. For example, where layer 210 is formed from a dispersion of two or more materials, the composition of the dispersion can be selected based upon the results of the monitoring step. Several stock dispersions can be provided, each having different resistivities in the cured state, and one of these may be selected based upon the monitored resistance after deposition of the first layer.

Typically, numerous resistors are formed in each panel. The monitoring step may be conducted by monitoring the resistance of each resistor individually after deposition of the first layer or after deposition of a subsequent layer. More typically however, the monitoring step is conducted by monitoring less than all of the resistors in less than all of the vias. Thus, the adjustment made in deposition of a second or subsequent layer based upon such a monitoring step will compensate for the effects of variations in the depositing process which affect all of the resistors uniformly, but will not compensate for differences in process conditions among the various vias being filled or differences in via diameter. Normally, the process conditions used to deposit the resistive layers are controlled so as to minimize differences among the various vias being treated. For example, in a chemical vapor deposition or sputtering operation, the panel may be moved during the process so that each via is exposed to conditions prevailing in different portions of the process chamber during deposition of the resistive material. The resistors selected for testing during the monitoring step desirably are distributed at widely separated locations on the panel. The resistors which are tested may be special "dummy" resistors provided for that purpose and not used as electrical compounds in the finished product.

Figure 16:
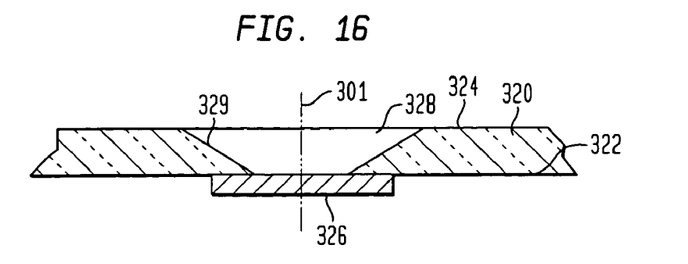
FIGS. 16–18 are diagrammatic sectional views depicting a panel in accordance with yet another embodiment of the invention during successive stages in a fabrication procedure.
Figure 17:
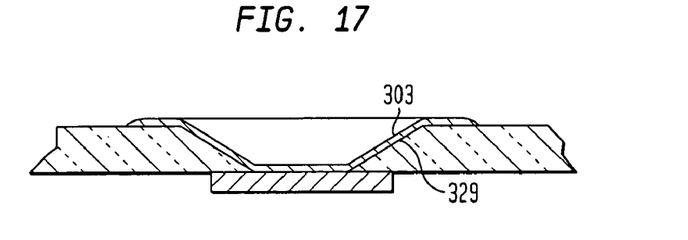
Figure 18:
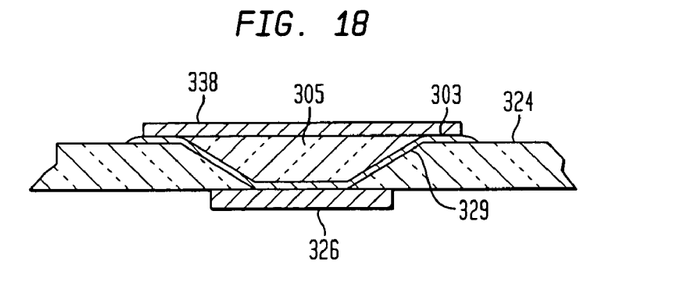

In a process according to a further embodiment of the invention, depicted in FIGS. 16–18, vias 328 are formed in a body 320. Here again, the dielectric material in the body defines a via wall 329. As illustrated in FIG. 16, via wall 329 may have a tapering or sloping configuration so that the via is generally in the form of a cone or other surface of revolution about an axis 301 between the top and bottom surfaces of the body. A bottom conductive material 326 is applied. In the particular embodiment illustrated in FIG. 16, the bottom conductive material is applied and formed into conductors prior to deposition of the resistors. In the next stage of the process (FIG. 17), a thin layer of a material referred to herein as the "outer" material 303 is applied so that the outer material extends along the wall 329 of the via. The outer material may be applied, for example by deposition from a gaseous or vapor phase such as evaporation, sputtering, chemical vapor deposition or the like or by electroless plating or electroplating. In the particular embodiment depicted, the outer material forms a continuous shell extending around the entire circumference of the via and over the entire wall surface 329. However, this is not essential; the outer material may be applied as one or more strips extending along the via wall, the top surface to the bottom surface of body 320.

After deposition of the outer material, an inner material 305 is deposited in the via so that the outer material 303 lies between the inner material and the via wall 329. For example, where the outer material is in the form of a continuous shell, the inner material is applied on the inside of the shell. The inner material has a resistivity higher than that of the outer material. Most preferably, the inner material is a dielectric having resistivity so high that conduction through the inner material does not appreciably influence the resistance of the finished resistor.

A top conductor 338 may be provided at top surface 324 of layer 320, in contact with outer material 303. This further conductor may be applied on top surface 324 of panel 320. Alternatively, the conductor at the top surface may be another circuit element in contact with the panel as, for example, a conductor on the neighboring panel. The resistance of the resistor (the resistance between the top conductor 338 in contact with the resistor at the top surface and bottom conductor 326) depends principally upon the resistance of the outer material. That resistance in turn depends upon the thickness of the outer material; the path length along the outer material form the bottom surface 322 to the top surface 324 and the average circumferential dimension of the via, which in turn depends upon the diameter of the via. However, because the circumference of the via varies linearly with diameter, this embodiment offers relatively low sensitivity to variations in via diameter. The process of depositing the outer material can be controlled by monitoring the resistance after a portion of the outer material has been deposited and controlling the remainder of the process based on the results of that monitoring step. Here again, the monitoring step need not be performed on every via but instead may be performed on only a sampling including less than all of the vias.

Because very thin layers of outer material can be deposited with reasonable control of layer thickness using the deposition processes discussed above, reasonable resistance values can be obtained in the embodiment of FIGS. 16–18 even where the outer material is a pure metal or other material having comparable resistivity.

Figure 19:
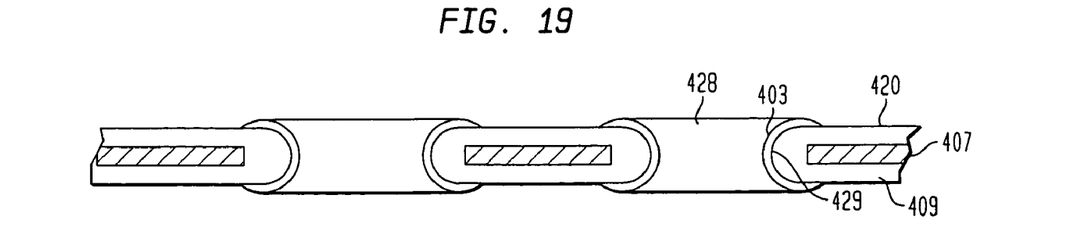
FIG. 19 is a diagrammatic sectional view of a panel in accordance with another embodiment of the invention.

In the embodiments discussed above, the body of every circuit panel is formed as a simple, pure layer of a dielectric material. However, as shown in FIG. 19, the body may have internal elements. For example, body 420 includes a metallic layer 407 and a dielectric coating covering the metallic layer. The dielectric layer defines the wall surfaces 429 of vias 428. Such body may be formed, for example, by electrophoretic deposition of a dielectric material on a metallic sheet having holes formed therein as described, for example, in U.S. Pat. No. 6,266,874, the disclosure of which is hereby incorporated by reference herein. After formation of the vias, additional processes such as laser ablation may be used to more precisely size the vias. A layer of a resistive material 403 similar to the outer layer 303 discussed above with reference to FIGS. 16–18 is deposited on the walls 429. The resistor can be used in this state. In this state, the resistor consists of a hollow shell or via liner formed by layer 403 and an empty or air-filled core within the interior of the shell. Alternatively, a dielectric material may be filled into the interior of the shell.

Figure 20:
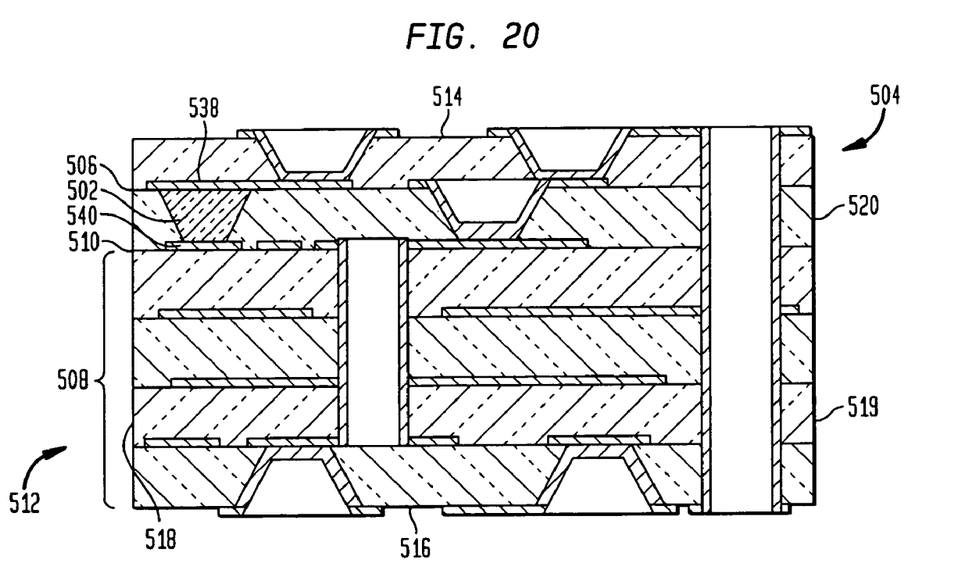
FIG. 20 is a diagrammatic sectional view depicting a multilayer unit in accordance with a further embodiment of the invention.

Circuit panels fabricated according to the embodiments discussed above can be employed as components of a multilayer element such as in multilayer circuit boards. As shown in FIG. 20, a circuit panel 520 has an embedded resistor 502 as described above extending between its top and bottom surfaces. Panel 520 is assembled with an overlying unit 504 so that the overlying unit confronts the top surface of panel 520 with bottom surface of the overlying unit confronting the top surface of the panel at an interface 506 between the overlying unit and panel 520. Similarly, the panel is assembled with an underlying unit 508, which in this embodiment includes a multiplicity of circuit panels. The bottom surface of panel 520 bearing the resistor 502 confronts the top surface of unit 508 at a further interface 510. The top conductor 538 and bottom conductor 540 associated with resistor 502 are disposed at interfaces 506 and 510. These top and bottom conductors may be formed as parts of panel 520 in the manner discussed above. Alternatively, one or both of conductors 538 and 540 may be formed as parts of the underlying and overlying units so that the conductors abut the resistive material in resistor 502 when panel 520 is laminated with the underlying unit 508 and overlying unit 504.

The resulting assembly 512 is a stacked multilayer circuit board with resistor 502 disposed in an intermediate layer, remote from the top surface 514 of the stack defined by unit 504 and remote from the bottom surface 516 defined by underlying unit 508. Resistor 502 is also remote from the edges of panel 520 and hence remote from the edges 518 and 519 of the stacked assembly. The resistor 520 is connected in circuit with further conductive elements of the stack. A typical assembly may include multiple resistors. Also, more than one of the circuit panels in the stack as, for example, one or more of the circuit panels in unit 508 may include embedded resistors as well.

Figure 21:
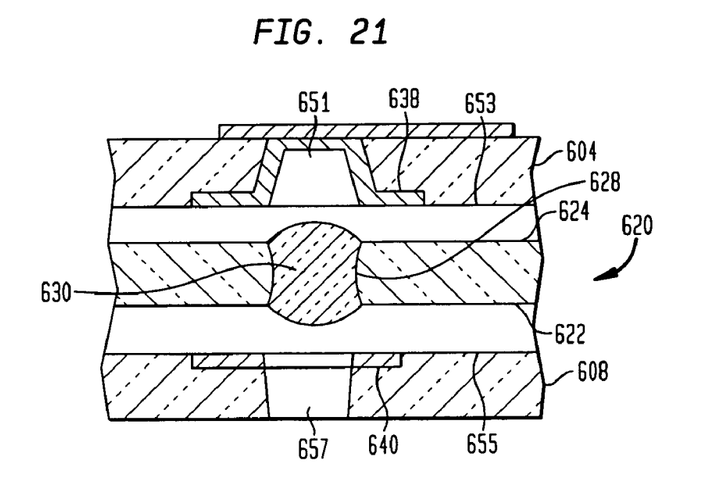
FIGS. 21 and 22 are diagrammatic sectional views depicting a multilayer unit in accordance with a further embodiment of the invention during successive stages of fabrication.
Figure 22:
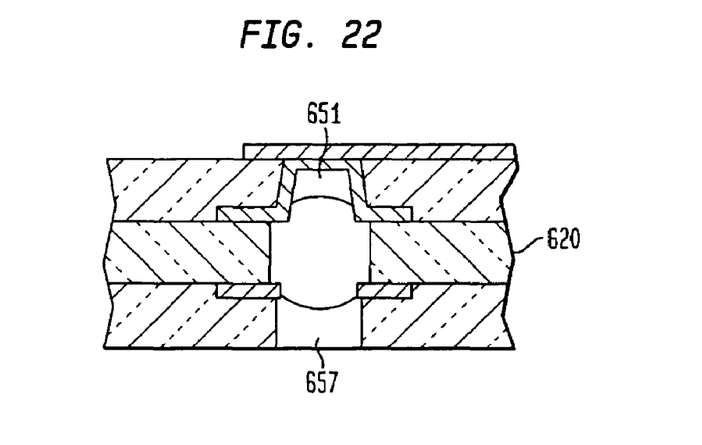

In a further variant, as shown if FIGS. 21 and 22, a panel 620 may be provided with vias 628 having composite resistive material 630 disposed in the vias and projecting slightly beyond the top surface 624, the bottom surface 622 or both of the panels. Such a panel may be assembled with an overlying unit 604 having a via with a conductive terminal 638 surrounding a space 651 in the overlying element. That space is open to the bottom surface 653 of the overlying element. Similarly, the underlying element 608 has a conductor 640 at its top surface 655 and has a further space 657 open to surface 655. When panel 620 is laminated with these elements, some portion of the resistive material 630 will be squeezed into spaces 651 and 657. To permit this action, resistive material 630 should be in a flowable condition during the lamination step. The resistive material may be left uncured until lamination is complete. Alternatively, the resistive material may be brought temporarily to a flowable state during the lamination procedure as, for example, by heat applied during the lamination process. In the lamination process, the confronting surfaces of panel 620 and elements 604 and 608 may be bonded to one another as, for example, by an adhesive or thermoplastic material carried on the surfaces. At the same time, conventional conductors on the various elements may be bonded to one another. The measures described in U.S. Pat. Nos. 5,367,764 and 5,282,312, the disclosures of which are incorporated by reference herein, may be employed. In the completed assembly, those portions of the resistive material which project into spaces 651 and 657 will not materially affect the electrical resistance between conductors 638 and 640. The ability to tolerate some projection of the resistive material in fabrication of panel 620 provides for a greater tolerance in the volume of resistive material dispensed during fabrication of panel 620.

Figure 23:
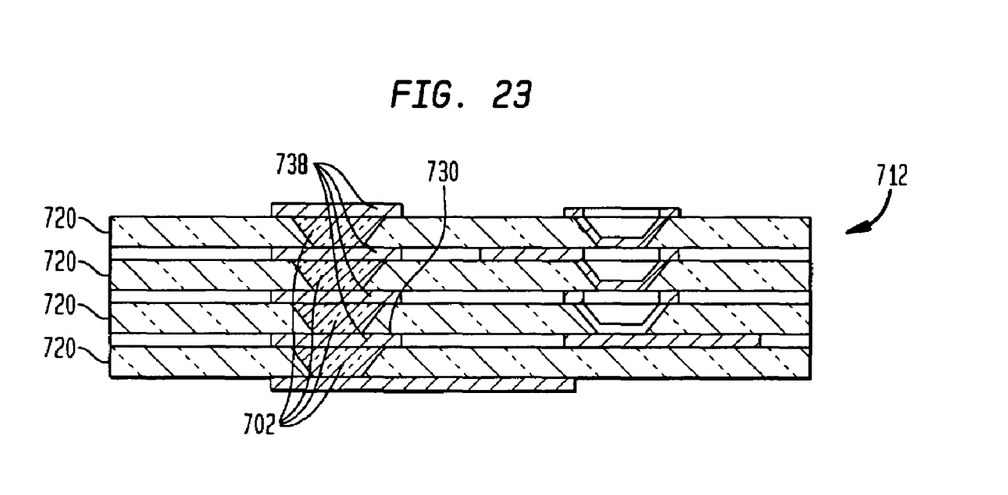
FIG. 23 is a diagrammatic sectional view depicting a unit in accordance with yet another embodiment of the invention.

The resistors discussed above may be stacked to form a composite series resistor extending through a plurality of panels in a stacked assembly. For example, as seen in FIG. 23, stacked assembly 712 includes several panels 720 with embedded resistors 702 in vias extending through them. These panels are superposed so that the vias incorporating these embedded resistors are aligned with one another, and so that the top conductor 738 of each such resistor serves as the bottom conductor of the aligned resistor on the next higher panel in the stack. Alternatively, if the resistors on each panel are provided with top and bottom conductors prior to stacking, the top conductor of one resistor can be bonded to the bottom conductor on the aligned resistor of the next higher panel in the stack. In another alternative, some of the panels are provided with empty vias and the panels are stacked so that the empty vias are aligned with one another. After stacking some or all of the panels to form a multi-panel unit, the resistive material is introduced into the aligned empty vias.

A series resistor extending through several panels can provide a higher resistance for the same via diameter or, alternatively, can permit the use of a larger via diameter for the same resistance using a given resistive material.

In the foregoing discussion, directions and locations relative to panels and assemblies of panels have been denoted by terms such as "top" and "bottom". As used herein with reference to a panel or assembly of panels, these directions, and terms such as "upwardly", "downwardly" and "vertically", should be understood as referring to directions and locations in the frame of reference of the panel or assembly, without reference to the normal gravitational frame of reference. Thus, the "top" surface of a panel is one major surface, whereas the "bottom" surface is the opposite major surface.

Numerous other variations and combinations of the features discussed above can be utilized without departing from the present invention. For example, it is not essential that all of the elements in a multilayer structure as discussed above with reference to FIGS. 20–22 be circuit panels. Some or all of these elements may be other electrical or electronic components. In a variant of the monitoring and resistance-adjusting procedures discussed above, the deposited resistive layers such as layer 212 or layer 303 can be eroded after the testing procedure as, for example, by reverse sputtering or etching and the reverse sputtering or etching process can be controlled in response to the results of the testing procedure.

As these and other variations and combinations of the features discussed above can be utilized, the foregoing description of the preferred embodiments should be taken by way of illustration rather than by way of limitation of the invention as defined by the claims.

The invention claimed is:

1. A circuit panel including:
  (a) a first panel body having top and bottom surfaces and a first via extending along an axis between said top and bottom surfaces;
  (b) a first composite resistor disposed in said first via, said composite resistor including at least two layers of different materials, wherein each layer has a different conductivity and at least one layer extends in one or more directions that are nonparallel to the axis, and
  (c) conductors disposed at said top and bottom surfaces of said panel in contact with said resistor.

2. A circuit panel as claimed in claim 1, wherein at least one layer extends in a direction that is perpendicular to the axis.

3. A circuit element comprising:
  (a) a stack of elements, said stack having exposed surfaces, said stack including:
    (i) a first interior panel having top and bottom surfaces, edges, and a first interior via extending between said surfaces remote from said edges;
    (ii) an overlying element having a bottom surface confronting the top surface of said first interior panel to define an upper interface at the top surface of the first interior panel; and
    (iii) an underlying element having a top surface confronting the bottom surface of said first interior panel to define a lower interface at the bottom surface of the first interior panel;
  (b) a first resistor disposed within said first interior via remote from the exposed surfaces of the stack, said resistor having a top surface, a bottom surface, and an axis extending from the top surface to the bottom surface; and
  (c) conductors extending within the stack, said conductors including conductors at said upper and lower interfaces in contact with said resistor;
  wherein said first resistor includes at least two layers of different materials, wherein each layer has a different conductivity and at least one layer extends in one or more directions that are nonparallel to the axis.

4. An element as claimed in claim 3 wherein the at least one layer extends in a direction that is perpendicular to the axis.

\* \* \* \* \*

UNITED STATES PATENT AND TRADEMARK OFFICE
CERTIFICATE OF CORRECTION

PATENT NO. : 7,049,929 B1  Page 1 of 1
APPLICATION NO. : 10/136964
DATED : May 23, 2006
INVENTOR(S) : Joseph Fjelstad It is certified that error appears in the above-identified patent and that said Letters Patent is hereby corrected as shown below:

Column 7, line 30, "each 228" should read -- each via 228 --.

Signed and Sealed this

Seventeenth Day of October, 2006

JON W. DUDAS
*Director of the United States Patent and Trademark Office*